United States Patent [19]

Obama et al.

[11] Patent Number: 4,963,818
[45] Date of Patent: Oct. 16, 1990

[54] CURRENT SENSOR HAVING AN ELEMENT MADE OF AMORPHOUS MAGNETIC METAL

[75] Inventors: Masao Obama, Yokosuka; Masaaki Kikuchi, Tokyo, both of Japan

[73] Assignee: Kabushiki Kaisha Toshiba, Kawasaki, Japan

[21] Appl. No.: 408,366

[22] Filed: Sep. 18, 1989

[30] Foreign Application Priority Data

Sep. 22, 1988 [JP] Japan .................................. 63-238017
Aug. 16, 1989 [JP] Japan ................................... 1-210135

[51] Int. Cl.⁵ ......................... G01R 33/00; H01F 3/04
[52] U.S. Cl. .................................. 324/117 R; 324/126; 324/249; 324/253
[58] Field of Search ............... 324/117 R, 117 H, 126, 324/127, 252, 253, 255, 254, 249; 332/173

[56] References Cited

U.S. PATENT DOCUMENTS

| | | | |
|---|---|---|---|
| 3,271,665 | 9/1966 | Castro et al. | 324/249 |
| 3,562,638 | 2/1971 | Renard | 324/249 |
| 3,621,382 | 11/1971 | Valet | 324/249 |
| 3,626,291 | 12/1971 | Yauch | 324/117 R |
| 4,280,093 | 7/1981 | Houston | 324/117 R |
| 4,500,838 | 2/1985 | Bloomer | 324/117 R |
| 4,825,166 | 4/1989 | MacGugan | 324/253 |

FOREIGN PATENT DOCUMENTS 63-205570 8/1988 Japan .
64-6767 1/1989 Japan .

Primary Examiner—Reinhard J. Eisenzopf
Assistant Examiner—Vinh P. Nguyen
Attorney, Agent, or Firm—Oblon, Spivak, McClelland, Maier & Neustadt

[57] ABSTRACT

A current sensor having an element made of amorphous magnetic metal is disclosed herein. The current sensor includes an element located near a conductor and made of amorphous magnetic metal whose magnetic property varies in accordance with the intensity of a magnetic field generated from a current flowing through the conductor, magnet applying a DC-bias magnetic field to the element, a coil exhibiting electrical property corresponding to the magnetic property of the element, and output device for outputting a signal corresponding to the electrical property of the coil. The coil has a specific positional relationship with the element, such that at least part of the magnetic flux generated by the coil passes through the element.

10 Claims, 10 Drawing Sheets

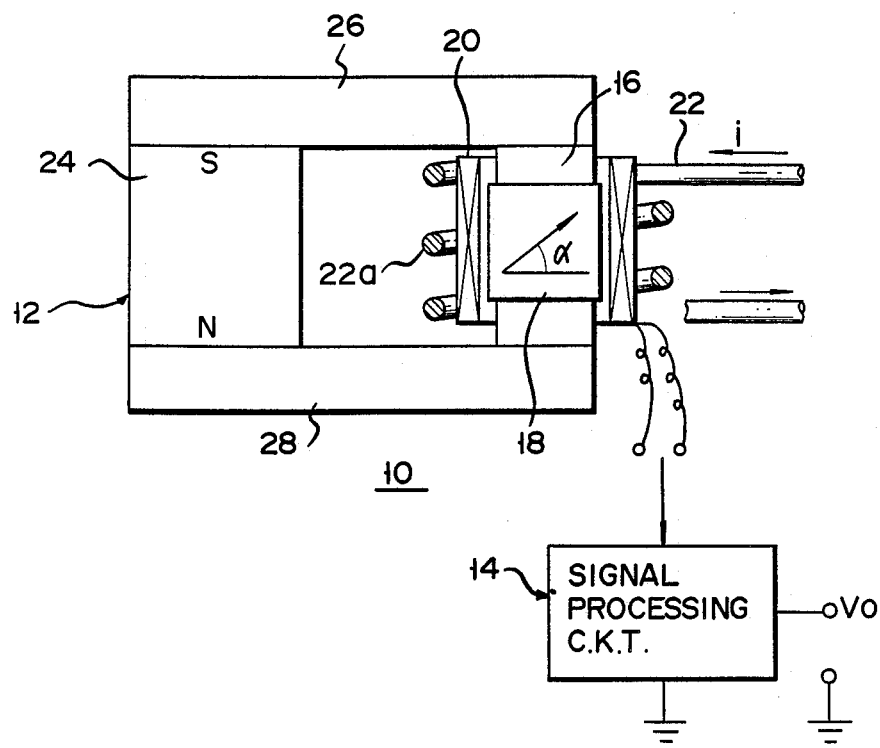
F I G. 1
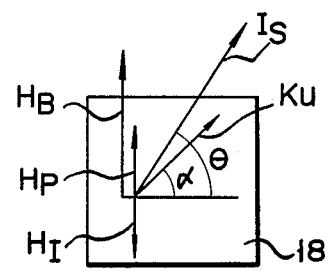
F I G. 2

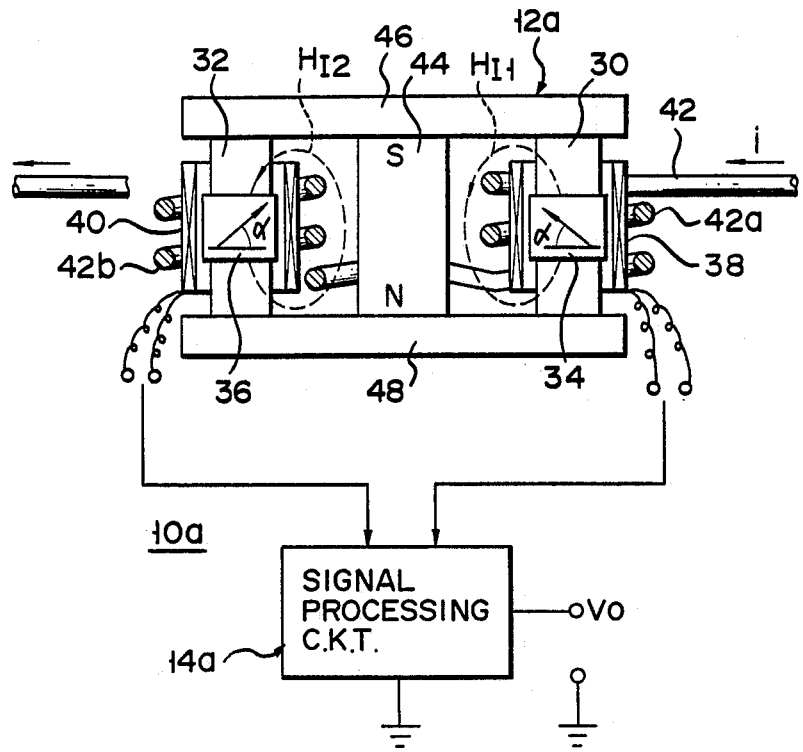
F I G. 3
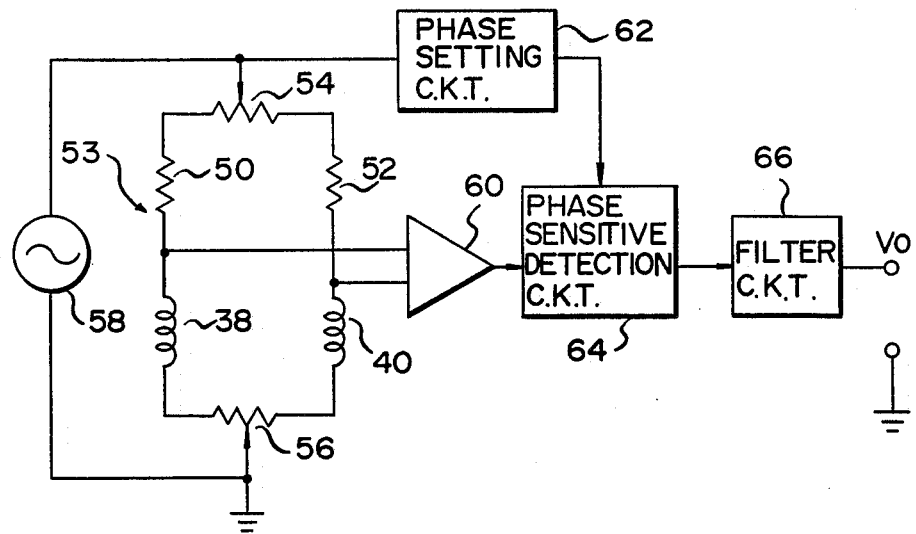
F I G. 4

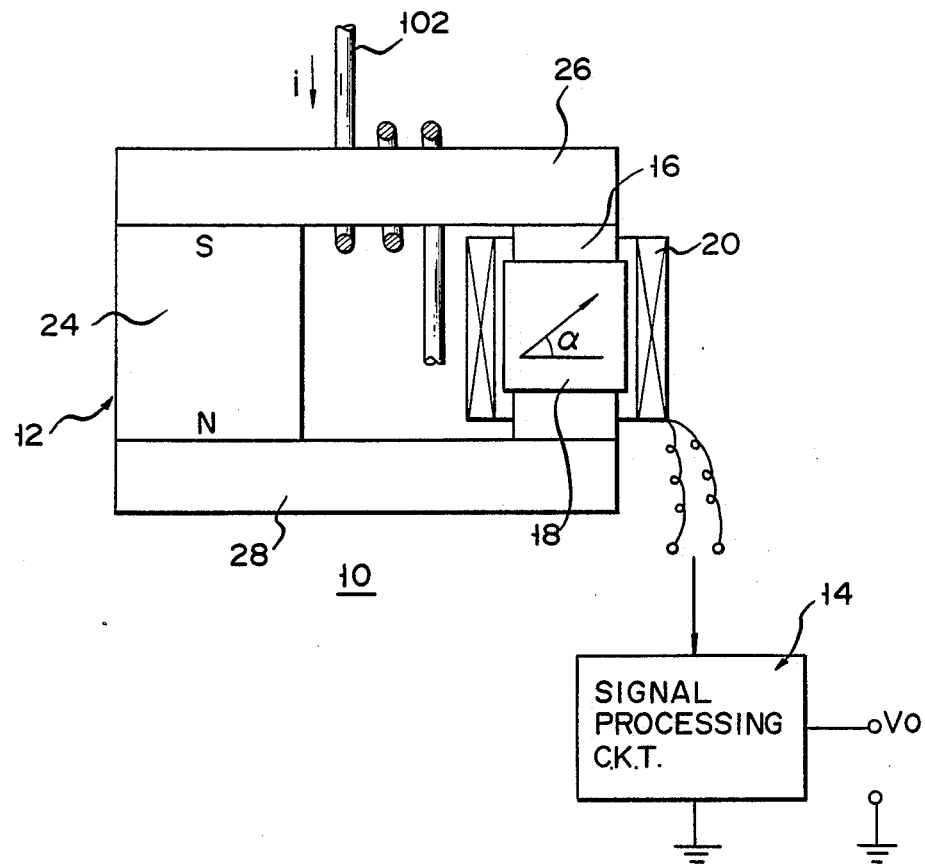
F I G. 15

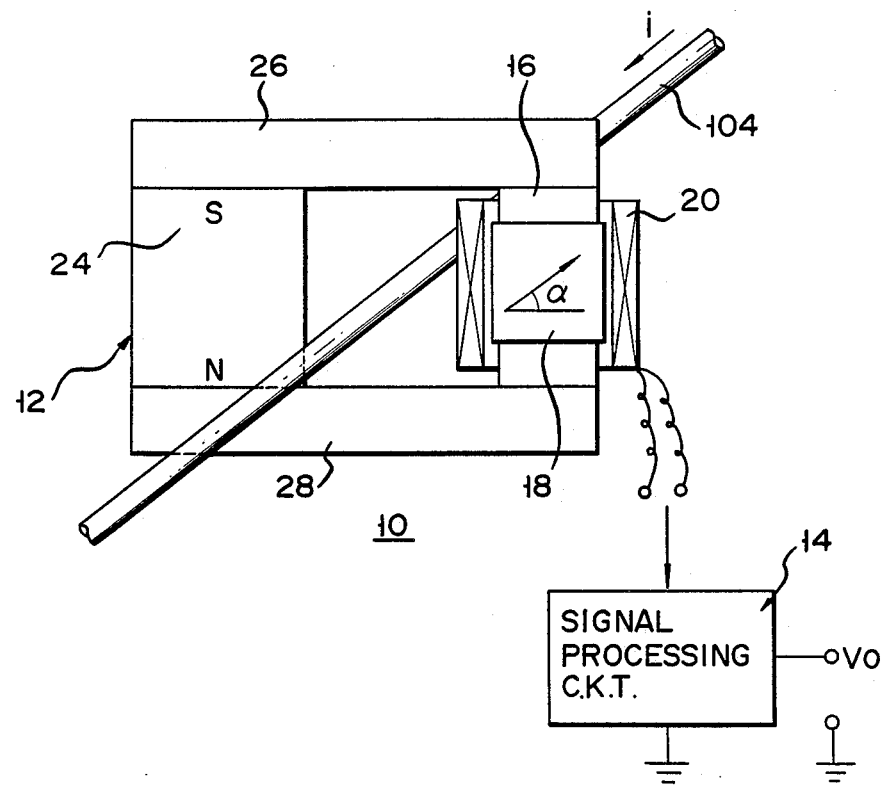
F I G. 16

CURRENT SENSOR HAVING AN ELEMENT MADE OF AMORPHOUS MAGNETIC METAL

BACKGROUND OF THE INVENTION

1. Field of the Invention

The present invention relates to a current sensor having an element made of amorphous magnetic metal.

2. Description of the Related Art

Various method of detecting electrical currents flowing in circuits are known. The typical ones of these methods are: voltage-drop detecting method, magnetic-field detecting method, and current-transformer method. In the voltage-drop method, the voltage drop across a resistor connected to a circuit is detected, thereby to determine the current flowing in the circuit. In the magnetic-field detecting method, a Hall element is used to determine the current flowing through the circuit. In the current transformer method, the variation of magnetic fluxes is utilized in order to determine the current flowing in this circuit.

With the voltage-drop detecting method, it is difficult to ensure sufficient insulation of the measuring system when the line voltage across the circuit is relatively high. Hence, this method can apply to low-voltage circuits only. Another problem inherent in this method is the heat generated by the resistor, which is enormous when a great current flows in the circuit. The magnetic-field detecting method has also a problem, i.e., the temperature drift of the Hall element. This temperature drift makes it essentially impossible to determine the current in the circuit, with sufficiently high accuracy. The magnetic-field detecting method, in which the current in the circuit is determined from the variation in the intensity of magnetic fluxes, is disadvantageous in that the current determined is not always correct.

As can by understood from the above, with the conventional current-detecting method it is impossible to measure the direct or alternating current flowing in a circuit and ranging over a broad range, always with ease and accuracy.

SUMMARY OF THE INVENTION

The first object of the present invention is to provide a current sensor which has an element having amorphous magnetic metal and which can detect the current flowing in a circuit, no matter how high is the line voltage across the circuit.

The second object of the invention is to provide a current sensor which has an element made of amorphous magnetic metal and which can detect a direct or an alternating current flowing in a circuit, with high accuracy, regardless of the ambient temperature.

The third object of this invention is to provide a current sensor which has an element made of amorphous magnetic metal and which can detect the current flowing in a circuit, always with a sufficiently high accuracy.

To achieve the above objects, a current sensor according to the invention comprises an element having amorphous magnetic metal, which is located near a conductor in order to detect the current flowing through this conductor. The amorphous magnetic metal exhibits magnetic anisotropy, and its magnetic property changes in accordance with the current flowing through the conductor. A DC-bias magnetic field is applied to the amorphous magnetic metal. A coil is located at a specific position with respect to the amorphous magnetic metal, such that at least part of the magnetic flux generated from the coil passes through the amorphous magnetic metal. The magnetic characteristics of the amorphous magnetic metal changes in response to the magnetic field generated from the current flowing through the conductor. The coil comes to have electrical property which corresponds to the change in the magnetic property of the amorphous magnetic metal. This electrical property is detected by a detecting circuit, which outputs a signal representing the electrical property of the coil.

The inventors hereof have found that an element made of amorphous magnetic metal exhibiting magnetic anisotropy has magnetic property which varies with the intensity of the magnetic field applied to it, more linearly than that of a element made of ordinary amorphous magnetic metal. They have also found that the magnetic property of an element made of the amorphous magnetic metal which exhibits magnetic anisotropy is more sensitive to changes in the intensity of the magnetic field, than that of an element made of ordinary amorphous magnetic metal, and remains constantly sensitive regardless of the ambient temperature.

When a current flows through the conductor, a magnetic field is generated around the conductor, whose intensity is proportional to the magnitude of the current. This magnetic field changes the magnetic property of the element made of the amorphous magnetic metal. As a result, the electrical property, e.g., AC impedance, of the coil changes. Hence, the AC impedance of the coil corresponds to the current flowing through the conductor. The DC-bias magnetic field serves to further improve the linearity with which the AC impedance of the coil changes in accordance with the current flowing through the conductor.

BRIEF DESCRIPTION OF THE DRAWINGS

Other objects and advantages of the invention will be apparent from the following description taken in conjunction with the accompanying drawings, in which:

FIG. 1 is a schematic representation of a current sensor according to a first embodiment of this invention, which has an element made of amorphous magnetic metal having magnetic anisotropy;

FIG. 2 is a diagram illustrating the directions in which magnetic fields are applied to the foil made of amorphous magnetic metal, incorporated in the current sensor shown in FIG. 1;

FIG. 3 is a schematic representation of a current sensor according to a second embodiment of the invention;

FIG. 4 is a block diagram showing the signal-processing processing circuit used in the current sensor shown in FIG. 3;

FIG. 15 is a schematic representation of a current sensor according to a seventh embodiment of this invention; and FIG. 16 is a schematic view showing a current sensor according to an eighth embodiment of the present invention.

DETAILED DESCRIPTION OF THE PREFERRED EMBODIMENTS

Figure 5:
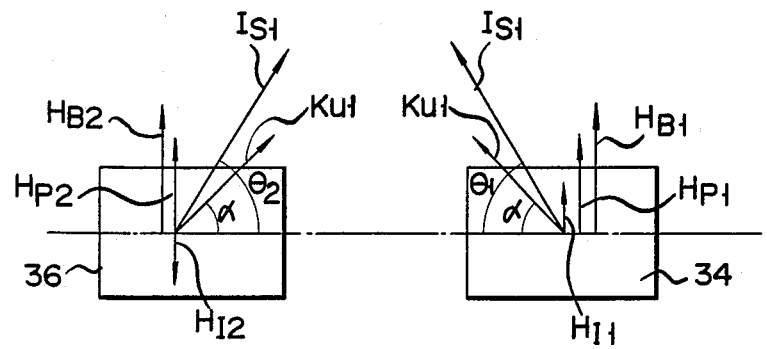
FIG. 5 is a diagram illustrating the directions in which magnetic fields are applied to the foil made of amorphous magnetic metal, incorporated in the current sensor shown in FIG. 3.

A current sensor 10, which has an element made of amorphous magnetic metal and is a first embodiment of this invention, will now be described with reference to FIG. 1.

As is evident from FIG. 1, this current sensor 10 comprises two main components, i.e., a current-detecting section 12 and a signal-processing circuit 14.

The current-detecting section 12 comprises a columnar or prism-shaped core 16 made of nonmagnetic material, a foil 18 made of amorphous magnetic metal, a coil 20, a conductor 22, a permanent magnet 24, and two yokes 26 and 28. The foil 18 is made of amorphous magnetic metal, and is wrapped around the core 16. The foil 18 exhibits single-axis anisotropy, and its magnetization axis inclines at angle $\alpha$ to the line intersecting at right angles with the axis of the core 16.

The coil 20 is wound around the foil 18. The conductor 22 is wound around, and spaced apart from, the coil 20, thus forming a few turns 22a. The current to be detected is made to flow through the conductor 22. The permanent magnet 24 applies a DC bias magnetic field to the foil 18 and is magnetized in such a manner as is shown in FIG. 1. The yokes 26 and 28 extend parallel to each other and at right angles to the axis of the core 16 and clamp the core 16. Those end portions of the yokes 26 and 28, which face each other, clamp the permanent magnet 24.

The signal-processing circuit 14 is designed to apply an AC voltage having a specified frequency f to the coil 20, and to output a voltage $V_0$ which corresponds to the AC impedance of the coil 20. The circuit 14 has the structure illustrated in FIG. 4, wherein numeral 38 is replaced with the coil 20 and a coil 40 is set to have a constant impedance. The signal-processing circuit 14 will be later described in greater detail, in conjunction with the description of the current sensor according to the second embodiment of the invention.

The operation of the current sensor 10 described above will now be explained. First, the signal-processing circuit 14 is operated, thereby exciting the coil 20 with an AC current. When a current i, which is to be detected, is made to flow through the conductor 22 while the coil 20 is being excited, that portion 22a of the conductor 22 which is wound around the coil 20 generates a magnetic field $H_I$ having an intensity which corresponds to the current i. This magnetic field $H_I$ extends along the axis of the foil 18 which is made of amorphous magnetic metal. Since the foil 18 exhibits single-axis anisotropy, the magnetic property, more precisely, the permeability of the foil 18 changes in accordance with the intensity of this magnetic field $H_I$.

The AC impedance of the coil 20 varies with the magnetic permeability of the foil 18 made of amorphous magnetic metal. In other words, the AC impedance of the coil 20 changes in accordance with the magnitude of the current i flowing through the conductor 22. Hence, the signal-processing circuit 14 outputs a voltage $V_0$ which corresponds to the AC impedance of the coil 20.

Meanwhile, the permanent magnet 24 applies a DC-bias magnetic field $H_B$ via the yokes 26 and 28 to the foil 18 in the axial direction thereof. This DC-bias magnetic field $H_B$ prevents the permeability of the foil 18 from changing non-linearly with the current i, even in the region where the intensity of the magnetic field $H_I$ is close to zero. Due to the DC-bias magnetic field $H_B$, the output voltage $V_0$ of the signal-processing circuit 14 can change linearly with the current i flowing through the conductor 22.

It will now be explained how the magnetic permeability of the foil 18 changes in accordance with the intensity of the magnetic field $H_I$ applied to the foil 18 which is made of amorphous magnetic metal having a single-axis anisotropy.

The magnetic field $H_I$ generated from the current i flowing through the conductor 22, the DC-bias magnetic field $H_B$ generated by the permanent magnet 24, and the magnetic field $H_P$ generated by the coil 20 are applied to the foil 18 made of amorphous magnetic metal, along the same line as is illustrated in FIG. 2. More precisely, the magnetic fields $H_P$ and $H_B$ extend in the same direction, whereas the magnetic field $H_I$ extends in the opposite direction. The magnetic anisotropy constant Ku of the foil 18 is determined by the composition of the amorphous magnetic metal forming this foil 18. The constant Ku is a vector, whose direction, i.e., the degree $\alpha$ of inclination of the axis of easy magnetization of the foil 18, is usually given by: $0 > \alpha > \pm\pi/2$. In the embodiment shown in FIG. 1, the angle $\alpha$ is nearly equal to $\pi/4$ as is shown in FIG. 2. The expression Is in FIG. 2 is constant value and represents a saturation magnetization which is determined by the composition and treatment of the foil 18.

As can be understood from FIG. 2, the magnetic energy E the foil 18 has is:

$$E = Ku \sin^2(\pi/4 - \theta) - I_S(H_P + H_B - H_I)\sin\theta \tag{1}$$

ps where $I_S$ is the magnitude of saturation magnetization and $\theta$ is the inclination angle of the axis of the saturation magnetization. The angle $\theta$ is of such a value as satisfies the equation of $\partial E/\partial \theta = 0$, i.e., the condition for minimizing the energy E. The component $I_0$ of saturation magnetization in the direction of the magnetic field $H_P$ is given by:

$$I_0 = I_S \sin\theta \tag{2}$$

The AC impedance of the coil 20 is proportional to $I_0$. As is evident from the equations (1) and (2), $I_0$ is a function of the intensity of the magnetic field $H_I$ generated from the current i which flows through the conductor 22. It follows that the AC impedance of the coil 20 varies with the current i, and the voltage $V_0$ output by the signal-processing circuit 14 corresponds to the current i. Hence, the device illustrated in FIG. 1 functions as a current sensor.

With reference to FIG. 3, a current sensor 10a according to a second embodiment of the present invention will now be described. This current sensor 10a is designed to detect a current, with accuracy irrespective of the ambient temperature. Like the current sensor 10 shown in FIG. 1, this sensor 10a has two main components, i.e., a current-detecting section 12a and a signal-processing circuit 14.

The current-detecting section 12a comprises a pair of cores 30 and 32, two foils 34 and 36, two coils 38 and 40, a conductor 42, a permanent magnet 44, and two yokes 46 and 48. The conductor 42 is wound around, and insulated from, the coil 38, thus forming a few turns 42a, and is also wound around, and insulated from, the coil 40, thus forming a few turns 42b. The permanent magnet 44 is located between the cores 30 and 32 and magnetized in such a manner as is shown in FIG. 3. The yokes 46 and 48 are arranged so as to apply the magnetic fluxes from the magnet 44 to the foils 34 and 36 in the axial directions thereof. The cores 30 and 32 are made of nonmagnetic material and either column-shaped or prism-shaped. They are arranged parallel to each other. Both foils 34 and 36 are made of amorphous magnetic metal and wrapped around the cores 30 and 32, respectively. The coils 38 and 40 are wound around the foils 34 and 36, respectively. The current, which is to detected, is made to flow through the conductor 42. The permanent magnet 44 applies a DC-bias magnetic field to the foils 34 and 36. The material of both foils 34 and 36, i.e., amorphous magnetic metal, exhibits single-axis anisotropy. Their axes of easy magnetization incline at an angle $\alpha$, which is about $\pi/4$, to a line intersecting at right angles with the axes of the foils 34 and 36. These axes of easy magnetization have a phase difference of $\pi/2$. The phase difference can be zero, according to the present invention. When a current i flows through the conductor 42, the turns 42a generates a magnetic field $H_{I1}$, and the turns 42b generates a magnetic field $H_{I2}$. The magnetic fields $H_{I1}$ and $H_{I2}$ extend in the opposite directions as is indicated by the broken lines in FIG. 3.

The signal-processing circuit 14a has the structure shown in FIG. 4. As is illustrated in FIG. 4, the coils 38 and 40 are connected with resistors 50 and 52, thus constituting a bridge circuit 53. The power-input terminals of this bridge circuit 53 are coupled to the output terminals of an AC oscillator 58 by means of variable resistors 54 and 56, both used as balance-controlling elements. The potential difference between the intermediate connecting points of the bridge circuit 53 is input to a differential amplifier 60. The output of the amplifier 60 is detected and rectified by a phase sensitive detection circuit 64 whose phase is set by a phase-setting circuit 62. The output of the phase sensitive detection circuit 64 is smoothed by a filter circuit 66, whereby the signal-processing circuit 14a outputs a voltage $V_0$.

The current sensor 10a, which has the above structure, can hardly be influenced by the changes in the ambient temperature, and can thus detect the current flowing through the conductor 42, with high accuracy, as will be understood more clearly from the following description of the operation of this sensor 10a.

When a current i flows through the conductor 42, the turns 42a and the turns 42b generate the magnetic fields $H_{I1}$ and $H_{I2}$, respectively. The magnetic fields $H_{I1}$ and $H_{I2}$ are applied to the foils 34 and 36, both made of amorphous magnetic metal, in the directions illustrated in FIG. 5. In the meantime, the DC-bias magnetic field $H_{B1}$ of the magnet 44 and the magnetic field $H_{P1}$ generated by the coil 38 are applied to the foil 34 in the directions shown in FIG. 5. Similarly, the DC-bias magnetic field $H_{B2}$ of the magnet 44 and the magnetic field $H_{P2}$ generated by the coil 40 are applied to the foil 36 in the directions shown in FIG. 5. More precisely, the magnetic fields $H_{I1}$, $H_{B1}$, and $H_{P1}$ are applied to the foil 34 in the same direction, whereas the magnetic fields $H_{B2}$ and $H_{P2}$ are applied to the foil 36 in the same direction, and the magnetic field $H_{I2}$ is applied to the foil 36 in the opposite direction. In FIG. 5, $Ku_1$ and $Ku_2$ designate constants of magnetic anisotropy which have been explained with reference to FIG. 2, and $I_{S1}$ and $I_{S2}$ denote magnitudes of saturation magnetization which have also been explained with reference to FIG. 2. As is shown in FIG. 5, the angle $\alpha$ is about $\pi/4$.

The magnetic energy $E_1$ the foil 34 has is:

$$E_1 = Ku_1\sin^2(\pi/4 - \theta_1) - I_{S1}(H_{P1} + H_{B1} - H_{I1})\sin\theta_1 \quad (3)$$

The magnetic energy $E_2$ the foil 36 has is:

$$E_2 = Ku_2\sin^2(\pi/4 - \theta_2) - I_{S2}(H_{P2} + H_{B2} - H_{I2})\sin\theta_2 \quad (4)$$

where the angles $\theta_1$ and $\theta_2$ of the saturation magnetizations $I_{S1}$ and $I_{S2}$ are of such values as satisfy the equations of $\partial E_1/\partial\theta_1 = 0$ and $\partial E_2/\partial\theta_2 = 0$, i.e., the conditions for minimizing the energies $E_1$ and $E_2$.

The component $I_{01}$ of saturation magnetization in the direction of the magnetic field $H_{P1}$, and the component $I_{02}$ of saturation magnetization in the direction of the magnetic field $H_{P2}$ are given by:

$$I_{01} = I_{S1}\sin\theta_1 \quad (5)$$

$$I_{02} = I_{S2}\sin\theta_2 \quad (6)$$

The AC impedances of the coils 38 and 40 are proportional to $I_{01}$ and $I_{02}$, respectively. As is evident from the equations (3), (4), and (5), $I_{01}$ and $I_{02}$ are functions of the intensities of the magnetic fields $H_{I1}$ and $H_{I2}$ generated from the current i which flows through the conductor 42. It follows that the AC impedances of the coils 38 and 40 vary with the current i, and the voltage $V_0$ output by the signal-processing circuit 14a corresponds to the current i. Hence, the device illustrated in FIG. 3 also functions as a current sensor.

The current sensor 10a illustrated in FIG. 3 has two current-detecting sections whose coils form a bridge circuit, and the bridge circuit functions to produce an output voltage. The sensor 10a can, therefore, cancel out the influence of the ambient temperature, thus increasing the accuracy of detecting the current i. But also can the sensor 10a achieve the advantage resulting from the use of the foils 34 and 36 both made of amorphous magnetic metal and the advantage resulting from the application of a DC-bias magnetic field from the magnet 44 to both foils 34 and 36.

The inventors hereof made a current-detecting circuit 12a having the structure shown in FIG. 3, wherein the conductor 42 has four turns 42a and four turns 42b, the magnet 44 has a surface flux density of 500 Gauss, the coils 38 and 40 have 240 turns each, the cores 30 and 32 have length of 30 mm and diameter of 6 mm, and the foils 36 and 38 have a width of 4 mm. They applied an AC voltage of 1.6V (rms), having a frequency of 100 KHz, to the bridge circuit 53 of this current sensor, and studied the relationship between the current i flowing though the conductor 42 and the output voltage $V_0$ of the current sensor. The results were as is represented by the solid line in FIG. 6. As the solid line clearly shows, the voltage $V_0$ changed with the current i with linearity when the current i ranged from $-5A$ to $+5A$.

Thereafter, the inventors hereof removed the permanent magnet 44 and the yokes 46 and 48 from the current sensor, and applied the same AC voltage of 1.6V (rms), having a frequency of 100 KHz, to the bridge circuit 53 of the sensor, and studied the relationship between the current i flowing though the conductor 42 and the output voltage $V_0$ of the current sensor. The results were as is indicated by the broken line in FIG. 6. As the broken line shows, the voltage $V_0$ changed with the current i non-linearly when the through i was relatively small.

Figure 6:
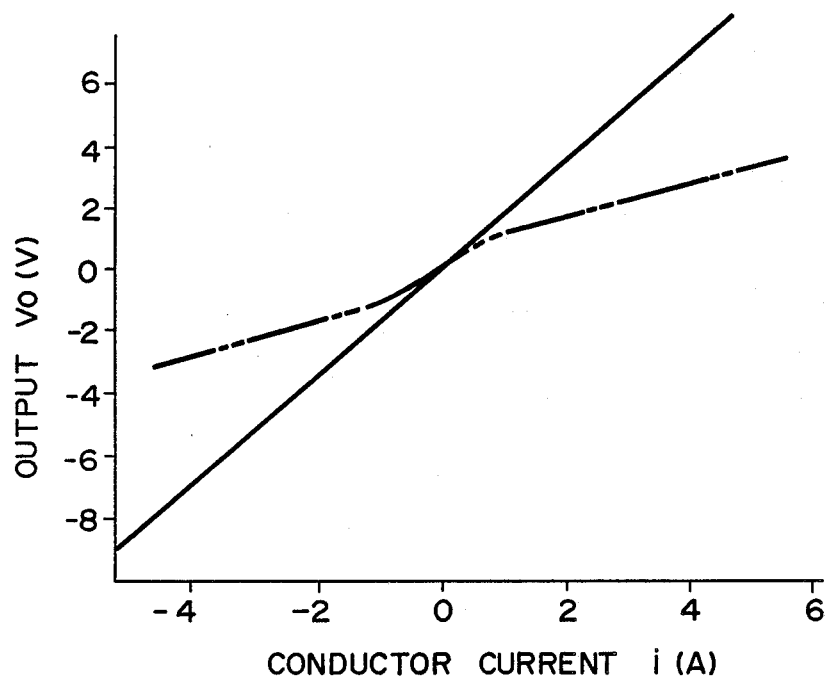
FIG. 6 is a graph representing the relationship between the current to be detected by the current sensor shown in FIG. 3 and the voltage output by this current sensor.

As the solid line and the broken line, both shown in FIG. 6, reveal, the DC-bias magnetic field of the permanent magnet 44 prevents the output voltage $V_0$ from changing non-linearly with the current i flowing in the conductor 42.

Further, the inventors raised the ambient temperature of the current-detecting sections of the sensor from $-20°$ C. to $+60°$ C., while maintaining the current i at the value of 5A, and studied how the output voltage V0 would vary with the temperature of the current-detecting sections. The output voltage $V_0$ changed at the rate of $\pm 0.04\%/°$ C. The change is only 1/2500 of the output voltage $V_0$, and the sensor according to the second embodiment (FIG. 3) is considered to have sufficient stability to the changes in the ambient temperature.

Figure 7:
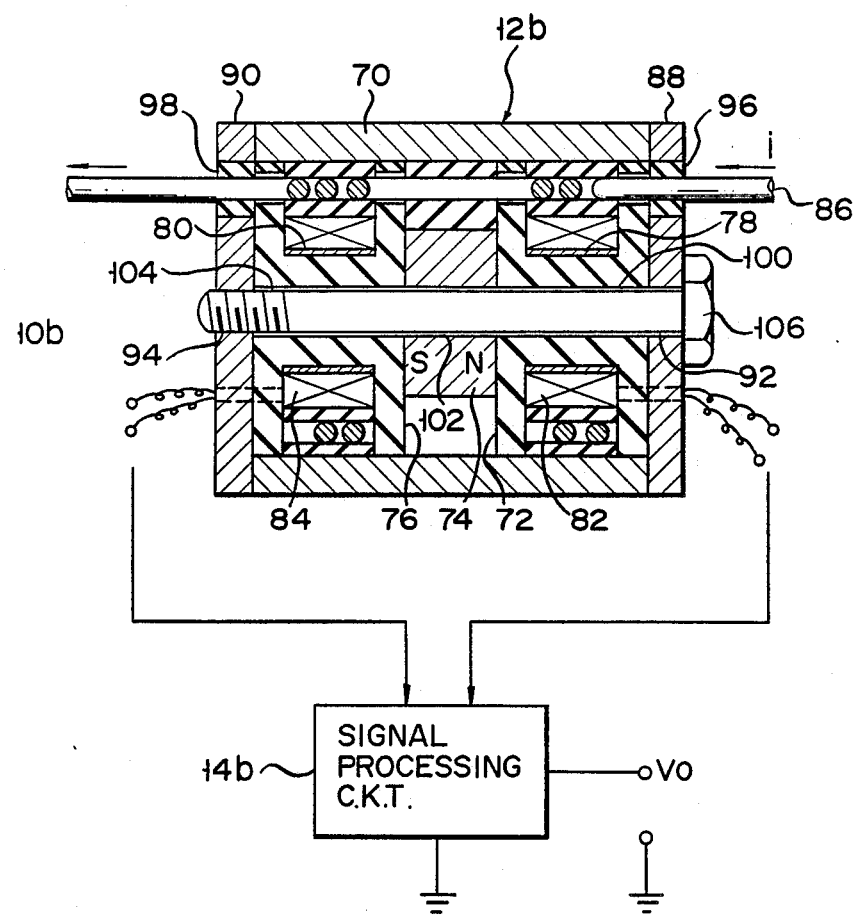
FIG. 7 is a schematic view showing a current sensor according to a third embodiment of the invention.

With reference to FIG. 7, a current sensor 10b according to a third embodiment of the present invention will now be described. This current sensor 10b is characterized by its current-detecting section 12b. As is illustrated in FIG. 7, the section 12b has two units which are arranged coaxially. The first unit comprises a foil 78 and a coil 82, and the second unit comprises a foil 80 and a coil 84. Both foils 78 and 80 are made of amorphous magnetic metal.

The current-detecting section 12b further comprises a hollow cylinder 70 made of magnetic material. Two ring-shaped bobbins 72 and 76, both made of electrically insulative material, and a ring-shaped permanent magnet 74 are located within the cylinder 70. The magnet 74 is interposed between the right bobbin 72 and the left bobbin 76. The bobbins 72 and 76 and the magnet 74 are coaxial with one another. The bias magnetic field of the permanent magnet 74 is applied to the foils 78 and 80, both made of amorphous magnetic metal and wrapped around the bobbins 72 and 76, respectively. The coils 82 and 84 are wound about the foils 78 and 80, respectively. Both foils 78 and 80 have been processed and have single-axis anisotropy. The axes of easy magnetization of these foils 78 and 80 are inclined at an angle $\alpha$ to a line which intersects at right angle with the axes of the bobbins 72 and 76, which are identical. Insulation layers are wrapped around the coils 82 and 84. A conductor 86 passes through the holes made in the flanges of the bobbins 72 and 76, and is wound a few times around the coil 82 and also around the coil 84. The current, which is to be detected, is made to flow through this conductor 86. End plates 88 and 90, made of magnetic material, are fastened to the ends of the cylinder 70. The end plate 88 has a relatively large hole 92 in the center portion, and the end plate 90 has a threaded hole 94 in the center portion. Both end plates 88 and 90 have holes 96 and 98, respectively, in their peripheral portions.

These holes 96 and 89 allow the passage of the conductor 86. A bolt 106 made of nonmagnetic material extends through the hole 92 of the end plate 88, the hole 100 of the bobbin 72, the hole 102 of the magnet 74, and the hole 104 of the bobbin 76. The end portion of the bolt 106 is screwed in threaded hole 94 of the end plate 90, whereby the cylinder 70 and the end plates 88 and 90 are connected together, thus forming a yoke, and whereby the components within the cylinder 70 are fastened together. The ends of the coil 82 are led outside through the two holes (not shown) made in the bobbin 72 and the end plate 88. Similarly, the ends of the coil 84 are led outside through the two holes (not shown) made in the bobbin 76 and the end plate 90.

The ends of the coil 82 and those of the coil 84 —all led from the current-detecting section 12b—are connected to the signal-processing circuit 14b. The circuit 14b is identical to the signal-processing circuit 14a illustrated in FIG. 4. It has coils 82 and 84 which are equivalent to the coils 38 and 40 incorporated in the signal-processing circuit 14a.

Hence, the current sensor 10b according to the third embodiment of the invention can also detect the current i flowing through the conductor 86 with high accuracy, for the same reason as the current sensor 10a illustrated in FIG. 3.

Figure 8:
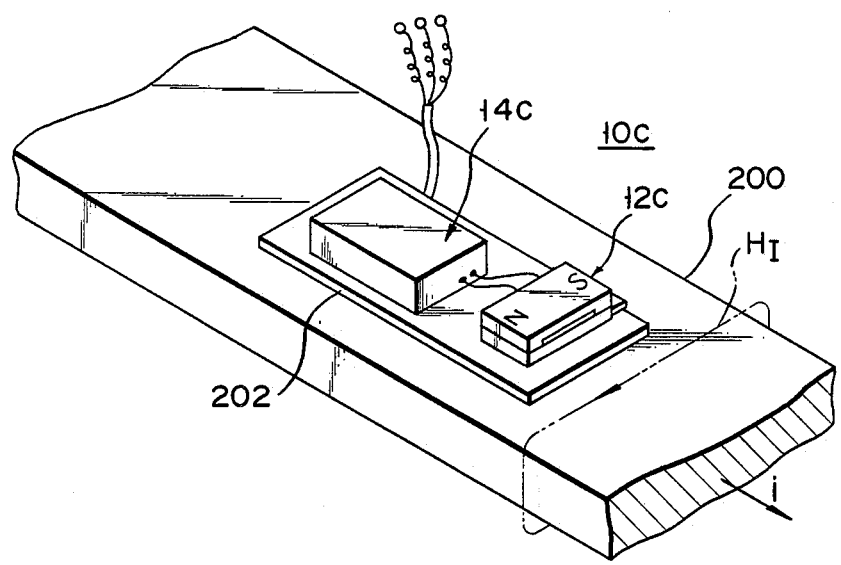
FIG. 8 is a perspective view of a current sensor according to a fourth embodiment of the present invention.

With reference to FIG. 8, a current sensor 10c according to a fourth embodiment of this invention will described. This sensor 10c can be attached to a conductor already installed, or a large conductor, so as to detect the current being supplying with the conductor. More specifically, as is shown in FIG. 8, an insulation substrate 202 is mounted on a conductor 200, shaped like a strip and designed to supply a great current of hundreds of amperes. Most components of the current sensor 10c are put on the insulation substrate 202. The current sensor 10c has two main components, i.e., a current-detecting section 12c and a signal-processing circuit 14c.

Figure 9:
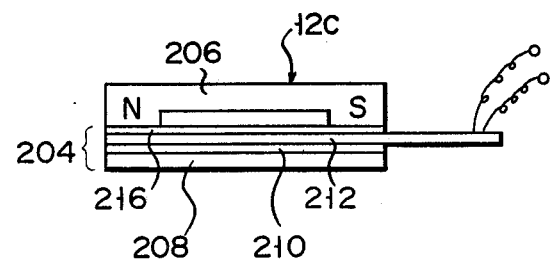
FIG. 9 is a side view illustrating the current-detecting section used in the sensor shown in FIG. 8.
Figure 10:
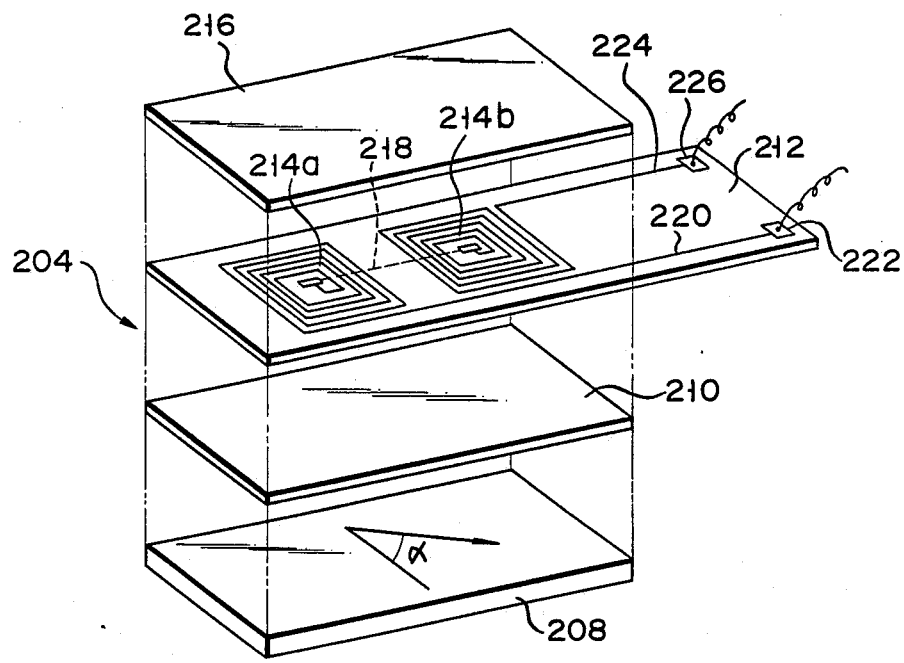
FIG. 10 is an exploded, perspective view of the current-detecting section shown in FIG. 9.

As is shown in FIG. 9, the current-detecting section 12c comprises a detector 204 and a permanent magnet 206. As is illustrated in FIG. 10, the detector 204 is composed of a plate 208 secured on the substrate 202, a thin insulation plate 210 fastened on the plate 208, a flexible insulation plate 212 secured on the plate 210, spiral patterned coils 214a and 214b mounted on the plate 212 and spaced apart from each other in the lengthwise direction of the plate 208, and a thin insulation plate 316 covering both patterned coils 214a and 214b. The plate 208 is made of amorphous magnetic metal and extends at right angles to the direction in which a current i flows through the conductor 200. The plate 208 has been processed and exhibits single-axis anisotropy. The axis of easy magnetization of this plate 208 is inclined at an angle $\alpha$ to a line which intersects at right angle with the axis of the plate 208. The wires forming the patterned coils 214a and 214b extend in the same direction. The inner ends of the coils 214a and 214b are connected by a connection lead 218 formed on the back of the insulation plate 212. The outer end of the patterned coil 214a is connected by a lead 220 to a terminal 222, and the outer end of the coil 214b is connected by a lead 224 to a terminal 226.

As is shown in FIG. 9, the permanent magnet 206 is fastened to the insulation plate 216, with its N pole and S poles opposing the patterned coils 214a and 214b, respectively. The magnetic field of the magnet 206 is used as a DC-bias magnetic field.

The terminals 222 and 226 are connected to the signal-processing circuit 14c. The circuit 14c has a structure almost identical to that of the signal-processing circuit 14a illustrated in FIG. 4.

Figure 11:
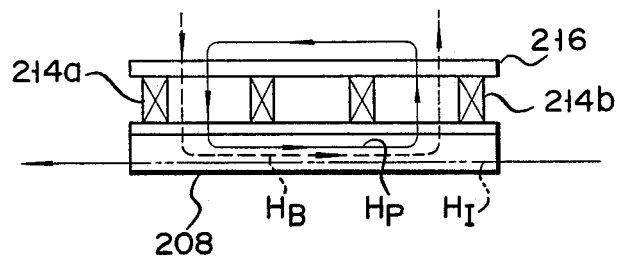
FIG. 11 is a diagram explaining the operation of the current-detecting section illustrated in FIG. 10.

In operation, when the current i flows through the conductor 200 as is indicated by the arrow in FIG. 8, the conductor 200 generates a magnetic field $H_I$ represented by the broken line in FIG. 8. This magnetic field $H_I$ is applied to the plate 208 made of amorphous magnetic metal as is shown in FIG. 11. When the signal-processing circuit 14c is operated, it applies an AC voltage to the patterned coils 214a and 214b. The coils 214a and 214b generate magnetic fields which extend in the opposite directions. Therefore, the magnetic field $H_P$ generated by the coils 214a and 214b is applied to the plate 208 as is indicated by the solid line in FIG. 11, in parallel to the magnetic field $H_I$ also being applied to the plate 208. Also, the DC-bias magnetic field $H_B$ of the permanent magnet 206 is applied to the plate 208, in parallel to the magnetic field $H_I$.

As has been described, the plate 208, which is made of amorphous magnetic metal, exhibits such magnetic anisotropy that its axis of easy magnetization is inclined at the angle $\alpha$ to the line which intersects at right angles with the axis of the plate 208, i.e., with the direction in which the magnetic field $H_I$ extends. Hence, the magnetic fields $H_I$, $H_P$, and $H_B$ are applied to the plate 208, exactly in the same way as has been explained with reference with FIG. 2. The AC impedances of the patterned coils 214a and 214b therefore vary with the current i flowing through the conductor 200, and the current i can be detected from the AC impedances of the coils 214a and 214b.

Since the plate 208 takes the above-mentioned specific positional relationship with the patterned coils 214a and 214b, the current sensor 10c according to the fourth embodiment requires no conductors for carrying the current which is to be detected. It suffices to mount the sensor 10c on a conductor already installed, in order to detect the current flowing through this conductor.

Figure 12:
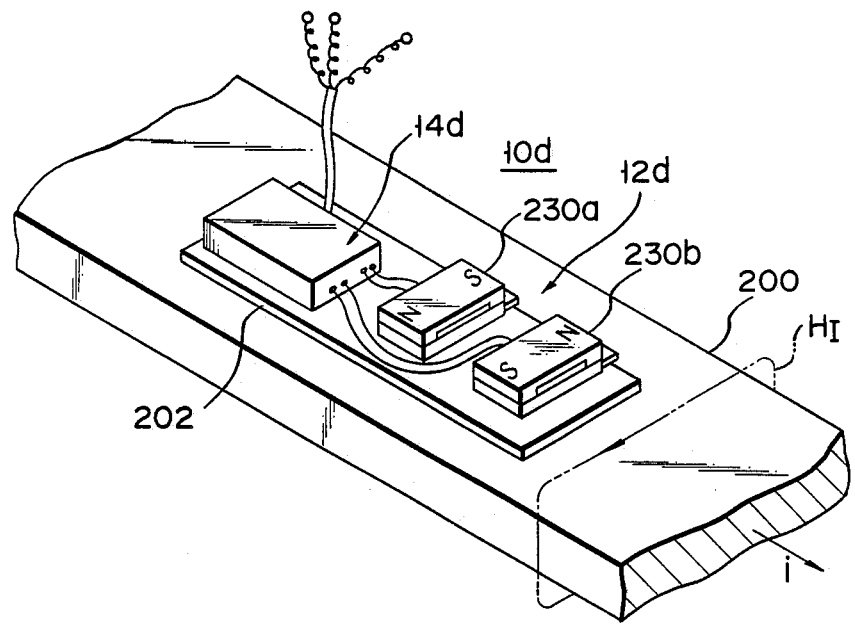
FIG. 12 is a perspective view of a current sensor according to a fifth embodiment of the present invention.

With reference to FIG. 12, a current sensor 10d according to a fifth embodiment of the present invention will now be described. This sensor 10d has a current-detecting section 12d which is identical to the section 12c shown in FIG. 8. The sensor 10d is designed to detect the current i flowing through a conductor 200 with high accuracy, regardless of the changes in the ambient temperature. In use, the sensor 10d is mounted on an insulative substrate 202 which is placed on the conductor 200.

The current sensor 10d according to the fifth embodiment also has two main components, i.e., a current-detecting section 12d and a signal-processing circuit 14d.

Figure 13:
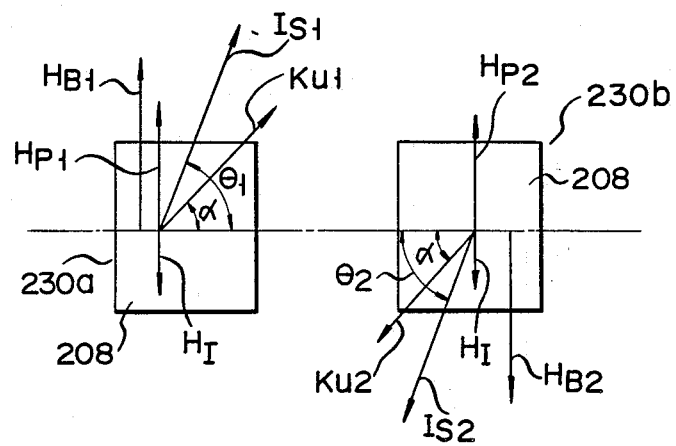
FIG. 13 is a diagram illustrating the directions in which magnetic fields are applied to the plates made of amorphous magnetic metal, incorporated in the first and second current-detecting sections illustrated in FIG. 12.

The current-detecting section 12d comprises first and second detectors 230a and 230b arranged on the insulative substrate 202, extending parallel to each other at right angles to the direction in which the current i flows through the conductor 200. Both detectors 230a and 230b have identical in structure to the current-detecting section 12c illustrated in FIGS. 9 and 10, except that, as is shown in FIG. 13, DC-bias magnetic fields $H_{B1}$ and $H_{B2}$ are applied in the opposite directions, that is, in two directions different by 180°.

The two spiral patterned coils of either detector, that are connected in series to each other, are connected to the signal-processing circuit 14d. The circuit 14d has the same structure as the signal-processing circuit 14a shown in FIG. 4, except that the patterned coils of the first detector 230a are used in place of the coil 38 (FIG. 4), and the patterned coils of the second detector 230b are used in place of the coil 40 (FIG. 4).

The current sensor 10d requires no conductors for supplying the current which is to be detected. It suffices to mount the sensor 10d on the conductor 200 already installed in a circuit, in order to measure the current flowing via the conductor 200. In addition, since the spiral patterned coils of the first detector 230a and those of the second detector 230b are used as two elements of the bridge circuit, like the current sensor 10a shown in FIG. 3, the current i can be detected with high accuracy, regardless of the changes in the ambient temperature.

The present invention is not limited to the embodiments described above. Various changes and modifications can be made, without departing the scope of the invention.

Figure 14:
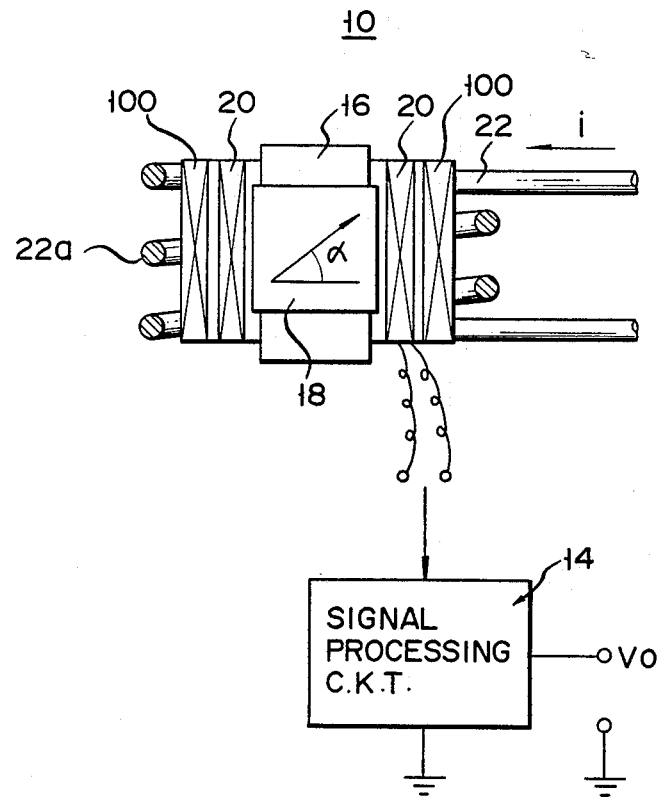
FIG. 14 is a schematic view of a current sensor according to a sixth embodiment of the present invention.

For example, the permanent magnet used in the above embodiments for providing an DC-bias magnetic field can be replaced by a coil 100 as in a six embodiment illustrated in FIG. 14. Except for the use of the coil 100, the sixth embodiment is identical to the current sensor 10 according to the first embodiment, which is illustrated in FIG. 1. The same numerals are therefore used in FIG. 14, denoting the same components as those of the current sensor 10 shown in FIG. 1.

Further, as is illustrated in FIG. 15 showing a seventh embodiment of the invention, a conductor 102 can be wound around a yoke 26, instead of winding the conductor 22 a few times around the coil 20 in the first embodiment (FIG. 1), or instead of winding the conductor 42 a few times around the coils 38 and 40 in the second embodiment (FIG. 3). Except for this aspect, the current sensor 10 according to the seventh embodiment is identical in structure to the first embodiment. Therefore, the same numerals are used in FIG. 15, denoting the same components as those of the current sensor shown in FIG. 1.

Still further, as is shown in FIG. 16 illustrating an eighth embodiment of the invention, a conductor 104 can be guided through the gap between a core 16 and a permanent magnet 24. Except for this aspect, the current sensor 10 according to the eighth embodiment is identical in structure to the first embodiment. Thus, the same numerals are used in FIG. 16, denoting the same components as those of the current sensor shown in FIG. 1.

Moreover, cores can be dispensed with. When no cores are used, a foil or foils made of amorphous magnetic metal, or a plate made of amorphous magnetic metal can be used as a core as well.

It should be noted that the current sensor according to the present invention can detect not only a direct current, but also an alternating current.

The current sensor according to this invention can be electrically insulated from the conductor carrying the current which the sensor is to detect. Further, the current sensor has no temperature drift, and can detect both a direct current and an alternating current with high accuracy. Moreover, since a DC-bias magnetic field is continuously applied to the foil or foils made of amorphous magnetic metal, or to a plate made of amorphous magnetic metal, the output voltage of the current sensor according to the invention varies quite linearly with the current which the sensor is measuring.

What is claimed is:

1. A current sensor comprising:
   an element made of amorphous magnetic metal whose magnetic permeability varies in accordance with the intensity of a first magnetic field generated from a current flowing through a conductor, said element having single-axis magnetic anisotropy and an axis of easy magnetization inclined at a predetermined angle to a direction in which said first magnetic field extends;
   magnetic field-applying means for applying a DC-bias magnetic field to said element, said DC-magnetic field extending parallel to the first magnetic field;
   a coil exhibiting impedance corresponding to the magnetic permeability of said element, said coil generating a second magnetic field which is applied to said element and extends parallel to the first magnetic field, and the impedance of said coil being determined by the component of a saturation magnetization of said element in the direction of said second magnetic field; and
   output means for outputting a signal corresponding to the impedance of said coil, said output means having a bridge circuit, specified side of which is constituted by said coil.

2. The current sensor according to claim 1, wherein said magnetic field-applying means includes:
   fastening means, made of nonmagnetic material, for fastening said element;
   a permanent magnet generating said DC-bias magnetic field; and
   guide means for guiding said DC-bias magnetic field of said permanent magnet to said element fastened to said fastening means.

3. The current sensor according to claim 1, wherein said element is shaped like a plate, an insulation plate is located above, and parallel to, said element, and said coil comprises a pair of spiral patterned coils formed on said insulation plate, said patterned coils being formed so as to generate magnetic fluxes extending in the opposite directions.

4. The current sensor according to claim 1, wherein said element and said coil are comprised of two units, the first unit consisting of an element made of amorphous magnetic metal and a coil, and the second unit consisting of an element made of amorphous magnetic metal and a coil; the two sides of the bridge circuit included in said output means are constituted by said coils; and said output means generates a signal from a signal supplied from an intermediate point of said bridge circuit.

5. A current sensor comprising:
   a first insulation plate;
   a plate-shaped element formed on said first insulation plate and made of amorphous magnetic metal whose magnetic permeability varies in accordance with a first magnetic field generated from a current flowing through a conductor, said element having single-axis magnetic anisotropy and an axis of easy magnetization inclined at a predetermined angle to a direction in which said first magnetic field extends;
   a flexible insulation plate formed on said element made of amorphous magnetic metal;
   a pair of spiral patterned coils formed on said insulation plate, said patterned coils being formed so as to generate second and third magnetic fields, respectively, which extend in the opposite directions with respect to said element, either patterned coil exhibiting impedance corresponding to the magnetic permeability of said element, the intensities of the second and third magnetic fields being applied to said element and extending parallel to the first magnetic field, and the impedances of either patterned coil being determined by the component of a saturation magnetization of said element in the direction of the magnetic field generated by the patterned coil;
   a second insulation plate covering said pair of spiral patterned coils;
   magnetic field-applying means formed on said second insulation plate, for applying an DC-bias magnetic field to said element, said DC-magnetic field extending parallel to the first magnetic field, one of the poles of said magnetic field-applying means being located on one of said pattern coils, and the other pole of said magnetic field-applying means being located on the other of said patterned coils; and
   output means for outputting a signal corresponding to the impedance of said patterned coils, said output means having a bridge circuit, specified sides of which are constituted by said patterned coils.

6. A current sensor comprising:
   an element located near a conductor and made of amorphous magnetic metal whose magnetic property varies in accordance with the intensity of a magnetic field generated from a current flowing through said conductor, said element having magnetic anisotropy;
   magnetic field-applying means applying a DC-bias magnetic field to said element;
   a coil exhibiting electrical property corresponding to the magnetic property of said element, said coil having a specific positional relationship with said element, such that at least part of the magnetic flux generated by said coil passes through said element; and
   output means for outputting a signal corresponding to the electrical property of said coil.

7. The current sensor according to claim 6, wherein said magnetic field-applying means comprises a permanent magnet used as a main component.

8. The current sensor according to claim 6, wherein said element made of amorphous magnetic metal is located such that the magnetic field generated from the current flowing through said conductor, the DC-bias magnetic field, and the magnetic field generated by said coil are applied to said element along with the same line.

9. The current sensor according to claim 6, wherein said element is shaped like a plate, an insulation plate is located above, and parallel to, said element, and said coil consists of a pair of spiral patterned coils formed on said insulation plate, said patterned coils being formed so as to generate magnetic fluxes extending in the opposite directions.

10. The current sensor according to claim 6, wherein said element and said coil are comprised of two units each consisting of an element made of amorphous magnetic metal and a coil, the two sides of the bridge circuit included in said output means are constituted by said coils of said units; and said output means generates a signal from a signal supplied from an intermediate point of said bridge circuit.

* * * * *